(12) United States Patent
Ananthan

(10) Patent No.: US 9,373,716 B2
(45) Date of Patent: Jun. 21, 2016

(54) IMPACT IONIZATION DEVICES, AND METHODS OF FORMING IMPACT IONIZATION DEVICES

(71) Applicant: Micron Technology, Inc., Boise, ID (US)

(72) Inventor: Venkatesan Ananthan, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/164,590

(22) Filed: Jan. 27, 2014

(65) Prior Publication Data

US 2014/0138766 A1  May 22, 2014

Related U.S. Application Data

(62) Division of application No. 12/053,977, filed on Mar. 24, 2008, now Pat. No. 8,674,434.

(51) Int. Cl.
H01L 29/788 (2006.01)
H01L 29/78 (2006.01)
H01L 29/739 (2006.01)
H01L 29/66 (2006.01)

(52) U.S. Cl.
CPC ...... *H01L 29/7827* (2013.01); *H01L 29/66666* (2013.01); *H01L 29/7391* (2013.01)

(58) Field of Classification Search
CPC . H01L 29/78; H01L 29/7827; H01L 29/0895; H01L 29/66666; H01L 29/083; H01L 29/868; H01L 29/7395; H01L 29/7835; H01L 29/7391; H01L 27/10802; H01L 2924/13091; H01L 27/1203; H01L 21/84; H01L 29/66477; H01L 27/108; H01L 29/0626; H01L 29/732; H01L 29/78648; H01L 29/8083
USPC .................. 257/320–322, 330–332; 438/149, 438/156–159, 164, 268–286
See application file for complete search history.

(56) References Cited

U.S. PATENT DOCUMENTS

| | | |
|---|---|---|
| 5,489,792 A | 2/1996 | Hu et al. |
| 5,877,056 A | 3/1999 | Wu |
| 5,918,115 A | 6/1999 | Kikuchi et al. |
| 6,121,666 A | 9/2000 | Burr |

(Continued)

FOREIGN PATENT DOCUMENTS

WO   2007008173 A1   1/2007

OTHER PUBLICATIONS

Abelein et al., Doping Profile Dependence of the Vertical Impact Ionization MOSFET's (I-MOS) Performance, Solid State Electronics, Elsevier Science Publishers, Barking, GB, Bd. 51, No. 10, 12, Oct. 12, 2007, Seiten 1405-1411, XP022296451 ISSN: 0038-11011, 1 page.

(Continued)

*Primary Examiner* — H Tsai
(74) *Attorney, Agent, or Firm* — TraskBritt

(57) ABSTRACT

Impact ionization devices including vertical and recessed impact ionization metal oxide semiconductor field effect transistor (MOSFET) devices and methods of forming such devices are disclosed. The devices require lower threshold voltage than conventional MOSFET devices while maintaining a footprint equal to or less than conventional MOSFET devices.

13 Claims, 9 Drawing Sheets

(56) References Cited

U.S. PATENT DOCUMENTS

| | | | |
|---|---|---|---|
| 6,133,099 | A | 10/2000 | Sawada |
| 6,232,822 | B1 | 5/2001 | Sakui et al. |
| 6,268,242 | B1 | 7/2001 | Williams et al. |
| 6,313,487 | B1 | 11/2001 | Kencke et al. |
| 6,406,973 | B1 | 6/2002 | Lee |
| 6,593,196 | B2 | 7/2003 | Akram et al. |
| 7,033,891 | B2 | 4/2006 | Wilson et al. |
| 7,056,761 | B1 | 6/2006 | Vashchenko et al. |
| 7,084,456 | B2 | 8/2006 | Williams et al. |
| 7,119,397 | B2 | 10/2006 | Fischer et al. |
| 7,189,606 | B2 | 3/2007 | Wang et al. |
| 7,253,060 | B2 | 8/2007 | Yun et al. |
| 2002/0019099 | A1* | 2/2002 | Williams et al. ............. 438/270 |
| 2004/0012057 | A1 | 1/2004 | Bennett |
| 2004/0259312 | A1 | 12/2004 | Schlosser et al. |
| 2005/0035398 | A1 | 2/2005 | Williams et al. |
| 2005/0224897 | A1 | 10/2005 | Chen et al. |
| 2006/0113612 | A1 | 6/2006 | Gopalakrishnan et al. |
| 2006/0125041 | A1 | 6/2006 | Yang et al. |
| 2006/0214221 | A1 | 9/2006 | Challa et al. |
| 2006/0220086 | A1 | 10/2006 | Charbuillet et al. |
| 2007/0029607 | A1 | 2/2007 | Kouznetzov |
| 2007/0187746 | A1* | 8/2007 | Kashimura ............ B82Y 10/00 257/315 |
| 2008/0001198 | A1 | 1/2008 | Jeon |
| 2008/0197406 | A1 | 8/2008 | Parthasarathy et al. |
| 2008/0272429 | A1 | 11/2008 | Ishiguro |
| 2009/0026553 | A1* | 1/2009 | Bhuwalka et al. ............ 257/402 |
| 2009/0129145 | A1* | 5/2009 | Slesazeck ..................... 365/174 |
| 2009/0236657 | A1 | 9/2009 | Ananthan |

OTHER PUBLICATIONS

Abelein et al., Improved Reliability by Reduction of Hot-Electron Damage in the Vertical Impact-Ionization MOSFET (I-MOS), IEEE Electron Device Letters, vol. 28, No. 1, Jan. 2007, pp. 65-97.

Bjork et al., Vertical Surround-gated Silicon Nanowire Impact Ionization Field-Effect Transistors, Applied Physics Letters, vol. 90, 2007, pp. 142110-1-142110-3.

Charbuillet et al., High Current Drive in Ultra-Short Impact Ionization MOS (I-MOS) Devices, IEEE, IEDM, San Francisco, Dec. 11, 2006, 16 pages.

Choi et al, 70-nm Impact-Ionization Metal-Oxide-Semiconductor (I-MOS) Devices Integrated with Tunneling Field-Effect Transistors (TFETs), IEEE, 2005, 4 pages.

Choi et al, 80nm Self-Aligned Complementary I-MOS Using Double Sidewall Spacer and Elevated Drain Structure and Its Applicability to Amplifiers with High Linearity, IDDD, 2004, pp. 203-206.

Choi et al., A Novel Biasing Scheme for I-MOS (Impact-Ionization MOS) Devices, IEEE Transactions on Nanotechnology, vol. 4, No. 3, May 2005, pp. 322-325.

Gopalakrishnan et al., I-MOS: A Novel Semiconductor Device with a Subthreshold Slope Lower than kT/q, IEEE, 2002, pp. 289-292.

Gopalakrishnan et al., Impact Ionization MOS (I-MOS)-Part I: Device and Circuit Simulations, IEEE Transactions on Electron Devices, vol. 52, No. 1, Jan. 2005, pp. 69-76.

Gopalakrishnan et al., Impact Ionization MOS (I-MOS)-Part II: Experimental Results, IEEE Transactions on Electron Devices, vol. 52, No. 1, Jan. 2005, pp. 77-84.

Irisawa et al., On the Origin of Increase in Substrate Current and Impact Ionization Efficiency in Strained—Si n- and p-MOSFETs, IEEE Transactions on Electron Devices, vol. 52, No. 5, May 2005, pp. 993-994.

Ouyang et al, Built-in Longitudinal Field Effects in Sub-100-nm Graded Si1-xGex Channel PMOSFETs, IEEE Transactions on Electron Devices, vol. 48, No. 6, Jun. 2001, pp. 1245-1250.

Sze, S.M., Semiconductor Devices Physics and Technology, 2nd Edition, John Wiley & Sons, Inc., 2002, p. 38.

Toh et al., A Strained N-channel Impact-ionization MOS (I-MOS) Transistor with Elevated Silicon-Carbon Source/ Drain for Performance Enhancement, IEEE, 2007, 2 pages.

* cited by examiner

IMPACT IONIZATION DEVICES, AND METHODS OF FORMING IMPACT IONIZATION DEVICES

CROSS-REFERENCE TO RELATED APPLICATION

This application is a divisional of U.S. patent application Ser. No. 12/053,977, filed Mar. 24, 2008, now U.S. Pat. No. 8,674,434, issued Mar. 18, 2014, the disclosure of which is hereby incorporated herein in its entirety by this reference.

TECHNICAL FIELD

Embodiments of the invention relate to impact ionization devices, such as semiconductor devices that include impact ionization metal oxide semiconductor field effect transistors (MOSFET), and to methods of making the same.

BACKGROUND

Metal oxide semiconductor (MOS) structures are basic electronic devices used in many integrated circuits. One such structure is the MOSFET, or metal oxide field effect transistor, which is conventionally formed in a semiconductor substrate by providing a gate structure over a channel region provided in a substrate, and by forming doped source and drain regions on opposing sides of the gate structure and the channel region of the substrate.

FIG. 1 illustrates a portion of a conventional MOSFET memory array device 5 comprising a single transistor. A conventional MOSFET memory array device 5 includes a gate structure 10 on a substrate 8. The substrate 8 is conventionally a bulk silicon substrate. The gate structure 10 conventionally includes a gate oxide 12, a conductive polysilicon layer 14, an overlying $WSi_x$ layer 16, an overlying oxide layer 18 and a $Si_3N_4$ capping layer 20. After depositing and patterning $Si_3N_4$ capping layer 20, spacers 40, 42 are formed from silicon nitride. Optional oxidized sidewalls 22, 24 may be formed on the gate structure 10, and optional oxide regions 26, 28 may be formed on the substrate 8. An ion implantation step may be performed to form source and drain regions 30, 32, which are both aligned to the edge of the gate structure 10.

To keep pace with the current trend toward maximizing the number of circuit devices contained in a single chip, integrated circuit designers continue to design integrated circuit devices with smaller feature sizes. However, as MOSFET devices are scaled down to the nanoscale region, critical problems can arise. One of the fundamental problems in continued scaling of MOSFETs is the 60 mV/decade room temperature limit for the subthreshold slope.

Devices have been proposed that use impact ionization to switch from the off to the on state. Such impact ionization devices may exhibit a subthreshold slope much lower than kT/q. The basic structure of a conventional impact ionization MOSFET device (I-MOS) 5' is shown in FIG. 2. A gate stack 10' is patterned and flanked by offset spacers 43. The source area 46 is masked while the drain 44 is formed. Secondary spacers 50 are formed to create the intrinsic region 52. Then, the drain area is masked while the source area 46 is implanted. While conventional MOSFET devices are doped NPN or PNP (source-drain-channel), I-MOS devices are NNP or PPN with the channel being more lightly doped than the source or drain.

Unfortunately, a planar I-MOS device 5' requires more space on a chip surface as compared to conventional MOSFET devices having the same gate length. Thus, L-shaped impact ionization transistors were created. However, such L-shaped transistors are formed using a complicated process flow. Conventional I-MOS devices operated at higher voltages than conventional MOSFET devices. Thus, impact ionization regions are preferably formed of germanium or silicon germanium, which lowers the required threshold voltage, but such materials are difficult to incorporate into conventional I-MOS devices using current processing techniques. Thus, it would be desirable to create an I-MOS structure than can be manufactured using a relatively straightforward process flow and of a design that does not exceed, or only slightly exceeds, the dimensions of conventional MOSFET devices.

DETAILED DESCRIPTION

The following description provides illustrative examples of embodiments of devices and methods of the invention with reference to the drawings. Such description is for illustrative purposes only and is non-limiting of the scope of the invention. Other embodiments of devices and methods may be implemented in accordance with the invention.

Embodiments of ionization devices including recessed or vertical structures for I-MOS devices are disclosed. Such structures enable methods of fabricating I-MOS devices without any extensive increase in process complexity relative to those employed in fabricating conventional MOSFET devices. In some embodiments of the invention, germanium or silicon germanium forms the impact ionization region, which may reduce the threshold voltage of the I-MOS and reduce or eliminate the need for any voltage biasing schemes.

In conventional MOSFET devices, the source and drain regions are aligned with (or even partially underlie) the gate. Thus, no separation exists between the gate edge and either the source or drain. By contrast, embodiments of impact ionization devices of the invention may have a gap between the source region and the gate. In conventional MOSFET devices, the source and drain regions are both either N+ type or P+ type. By contrast, the source and drain regions of embodiments of I-MOS devices of the invention have source and drain regions doped of opposite type. In other words, the source region may be either an N+ type or P+ type as long as the drain region is oppositely doped.

Figure 1:
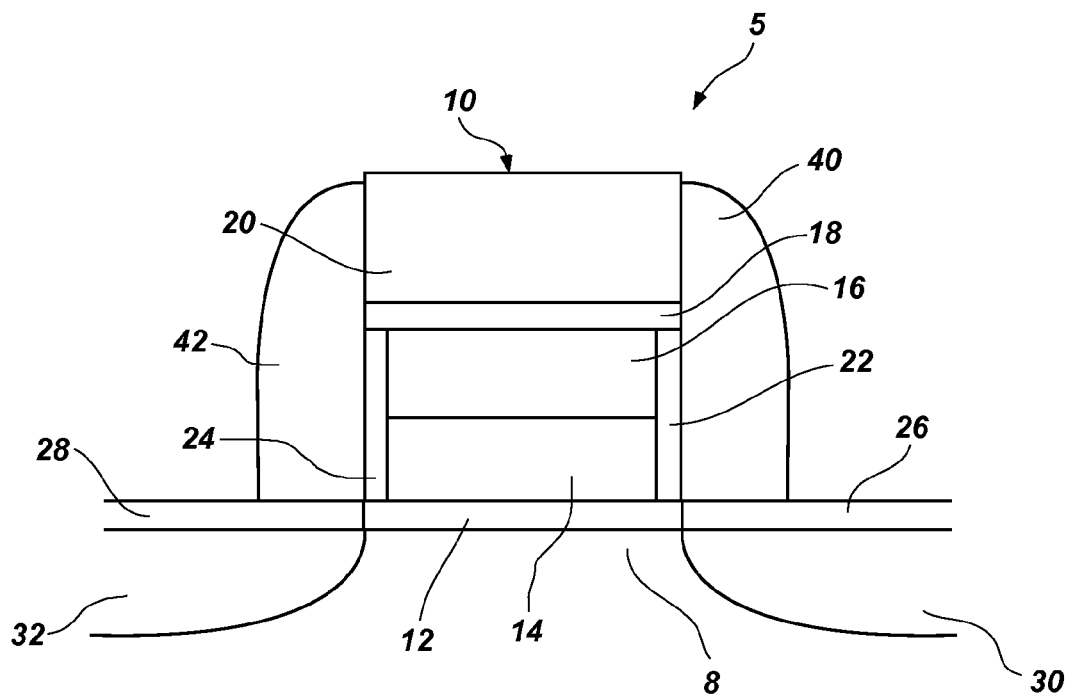
FIG. 1 is a cross-sectional view of a conventional MOSFET device.
Figure 2:
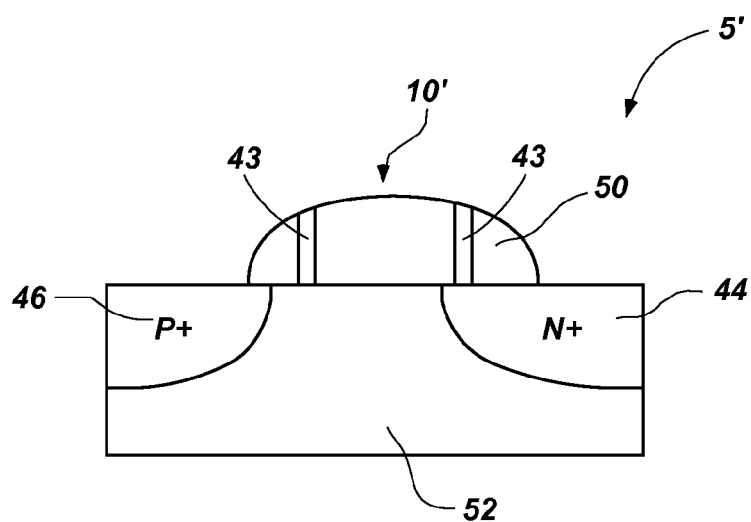
FIG. 2 is a cross-sectional view of a conventional I-MOS device.
Figure 3:
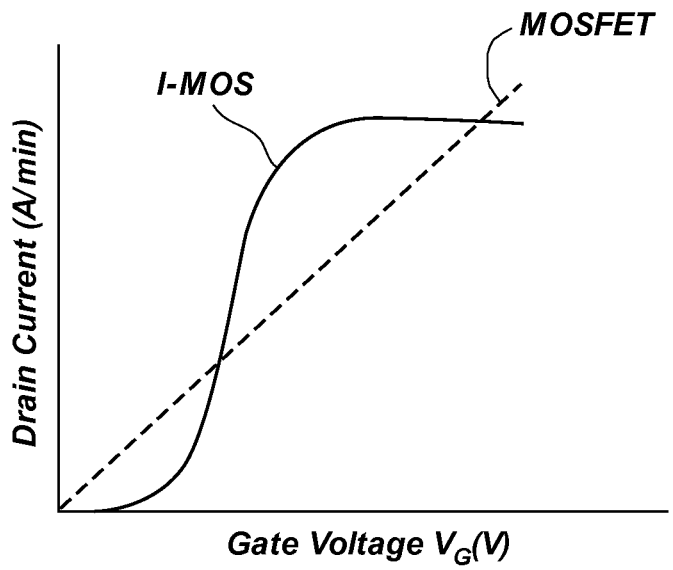
FIG. 3 illustrates the drain current as a function of the voltage applied to the gate for both a conventional MOSFET device and an embodiment of an I-MOS transistor of the invention.

Referring to FIG. 3, the subthreshold slope of a conventional MOSFET and an I-MOS device according to an embodiment of the invention are compared. The rate at which the transistor goes from an "off" state to an "on" state is faster, thus the slope is steeper for the I-MOS device. Impact ionization devices according to embodiments of the invention may have a subthreshold slope of approximately 5 mV/decade or less.

Figure 4:
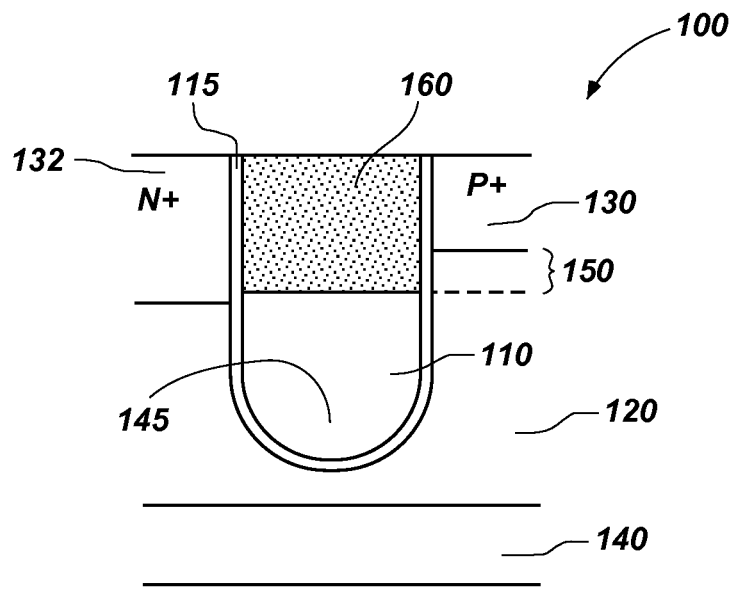
FIG. 4 is a cross-sectional view of an embodiment of a recessed I-MOS transistor of the invention.

Embodiments of the invention include recessed and vertical I-MOS devices. FIG. 4 depicts a portion of an example of an embodiment of an impact ionization device 100 of the invention and illustrates one transistor of a recessed I-MOS. The impact ionization device 100 may, in fact, comprise many such transistors (and other associated circuit components such as, for example, capacitors, conductive lines, conductive pads, etc.). The impact ionization device 100 may include a substrate 120, which may comprise a buried oxide layer 140 therein in some embodiments. A gate oxide 115 is formed in a trench 145 in the substrate 120. A gate 110 is formed in the trench 145, and a cap 160 of insulating or non-conducting material covers the gate 110 and may fill the trench 145. The transistor includes P+ doped source region 130. The source region 130 is formed on one side of the gate 110 and extends into the substrate 120. The source region 130 terminates before reaching the full depth of the gate 110. The transistor also includes an N+ doped drain region 132 that is formed on the opposite side of the trench from the source region 130 and also extends into the substrate 120. The drain region 132, like the source region 130, terminates before reaching the full depth of the gate 110. The drain region 132, however, extends deeper into the substrate 120 than the source region 130. The source region 130 and drain region 132 are separated by the gate 110 and, together with the region of the substrate 120 adjacent the gate 110, provide the current path for the impact ionization current. In this configuration, an impact ionization region 150 is provided between a lower boundary of the source region 130 and an upper boundary of the gate 110. As shown in FIG. 4, the impact ionization region 150 may be substantially rectangular.

Figure 5:
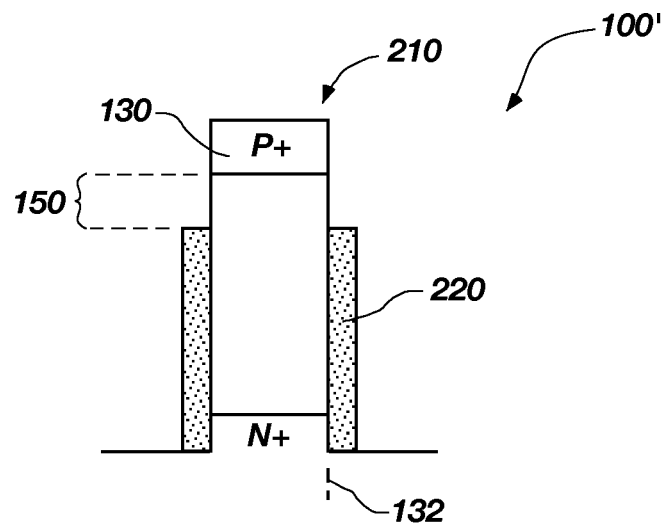
FIG. 5 is a cross-sectional view of an embodiment of a vertical I-MOS transistor of the invention.

FIG. 5 depicts an example of an embodiment of an impact ionization device 100' of the invention comprising a vertical I-MOS. A silicon pillar 210 includes a lower N+ drain region 132 and an upper P+ source region 130. The silicon pillar 210 may be flanked by a gate 220 formed from gate material. The gate 220 may surround the silicon pillar 210. In other words, gate material may be formed on one or more lateral surfaces of the silicon pillar 210 to form the gate 220 of the impact ionization device 100'. The gate 220 and the P+ source region 130 do not overlap, and an impact ionization region 150 may be provided in a region between the gate 220 and the source region 130. As shown in FIG. 5, the impact ionization region 150 may be substantially rectangular.

Figure 6:
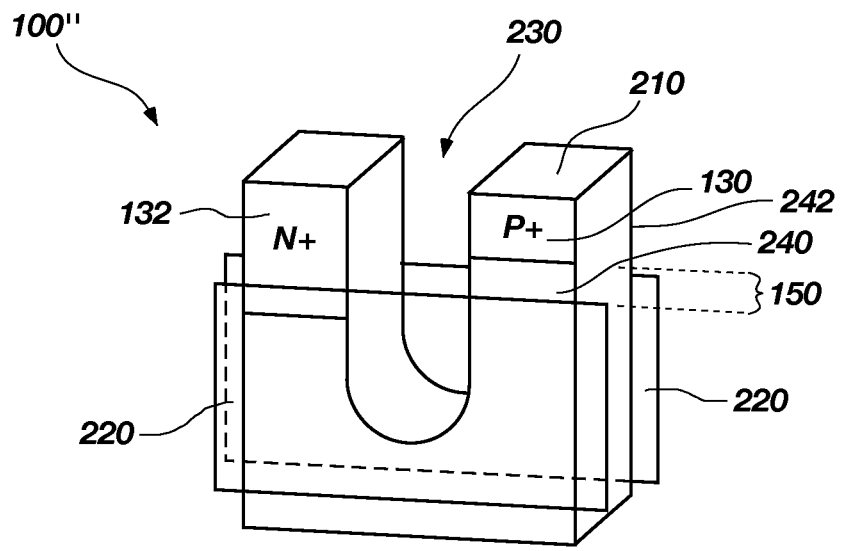
FIG. 6 is a plan view of a vertical cross-hair I-MOS transistor.

FIG. 6 depicts an example of an embodiment of an impact ionization device 100" of the invention comprising a crosshair structure. A silicon pillar 210 includes either an upper N+ drain region 132 or an upper P+ source region 130. The N+ drain region 132 and upper P+ source region 130 may be formed on a distinct silicon pillar 210 and separated by a vertical trench 230. The silicon pillar 210 may be flanked by a gate 220 formed from gate material. The gate 220 may extend on both a first side 240 and second side 242 of the silicon pillar 210. In other words, gate material may be formed on one or more parallel surfaces of the silicon pillar 210 to form the gate 220 of the impact ionization device 100". The gate 220 and the P+ source region 130 do not overlap, and an impact ionization region 150 may be provided in a region between the gate 220 and the source region 130. As shown in FIG. 6, the impact ionization region 150 may be substantially rectangular.

Figure 7A:
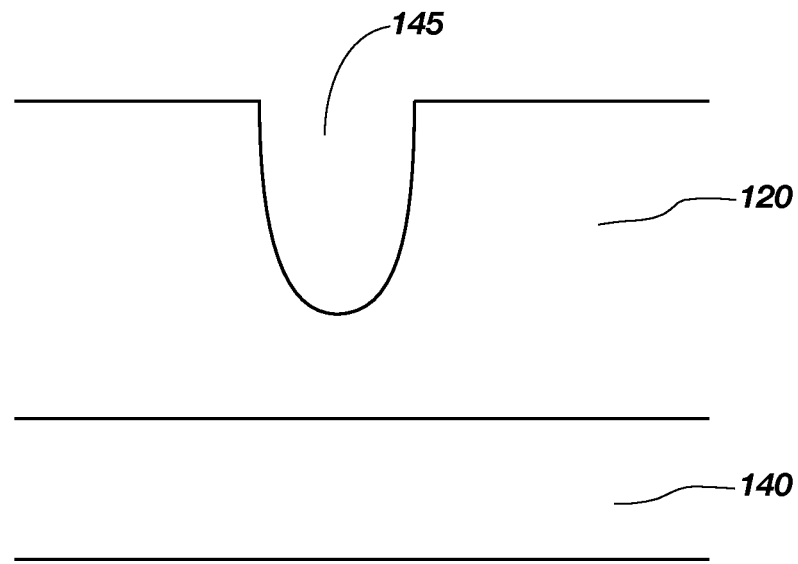
FIGS. 7A-7E are cross-sectional views of a work piece at various stages of an embodiment of a method of forming a recessed I-MOS transistor of the invention.

FIGS. 7A-7E depict an embodiment of a method of the present invention that may be used to form a recessed I-MOS device of embodiments of the present invention, such as the impact ionization device 100 shown in FIG. 4. Referring to FIG. 7A, a substrate 120 is provided. Optionally, the substrate 120 may include a buried oxide layer 140 therein. The substrate 120 may comprise, but is not limited to, a silicon wafer, epitaxial silicon layers, polysilicon layers, bonded wafers such as silicon-on-insulator (SOI) type substrates, and amporphous silicon layers, all of which may be doped or undoped. If the substrate is undoped, it may be doped with a first conductivity type dopant by conventional methods.

Next, a trench 145 may be formed in the substrate 120. The trench 145 may be formed by, for example, any conventional masking and etching process. By way of non-limiting example, the substrate 120 may be masked with an opening overlying the region of the substrate 120 in which the trench 145 will be formed. The material of the substrate 120 in that region may then be removed by etching through the opening in the mask to form the trench 145. The parameters of the etching process may be controlled to form rounded bottom corners, smooth and continuous sidewalls, clean trench bottom surfaces, and a desired trench depth. Conventionally, shallow trench isolation (STI) structures are approximately 2,500 Å deep. The trench 145 may be shallower than any adjacent STI structures. In one particular embodiment set forth as an example, the trench depth may be between approximately 800 Å-1,200 Å. In one embodiment, the trench depth is approximately 1,000 Å. After formation of the trench 145, the mask may be removed by conventional methods (FIG. 7A).

Figure 7B:
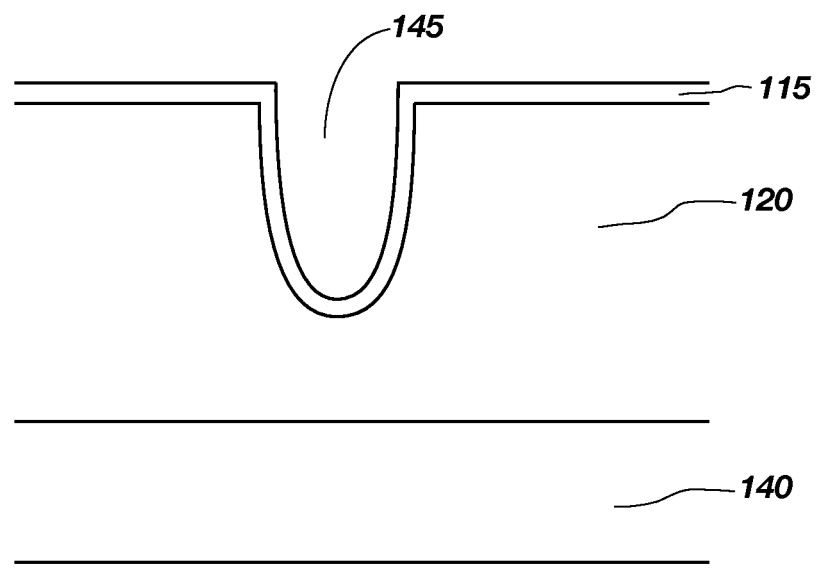

Next, gate dielectric material 115 may be formed over the substrate 120 and within the trench 145, as shown in FIG. 7B. The gate dielectric material 115 may comprise a thin layer of material having a relatively high dielectric constant. As one particular non-limiting example, the gate dielectric material 115 may comprise a silicon oxide ($SiO_2$). In additional embodiments, the gate dielectric material 115 may comprise silicon nitride ($Si_3N_4$), zirconium oxide ($ZrO_2$), hafnium oxide ($HfO_2$), hafnium silicide (HfSi), silicon hafnium oxynitride (SiHfON), hafnium silicate ($HfSiO_4$), lanthanum oxide ($La_2O_3$), or any combinations thereof. The gate dielectric material 115 may be formed by oxidizing or nitriding a surface of the substrate 120, or it may be deposited by chemical vapor deposition, (CVD), atomic layer deposition (ALD), physical vapor deposition (PVD), or by combinations of such processes.

Figure 7C:
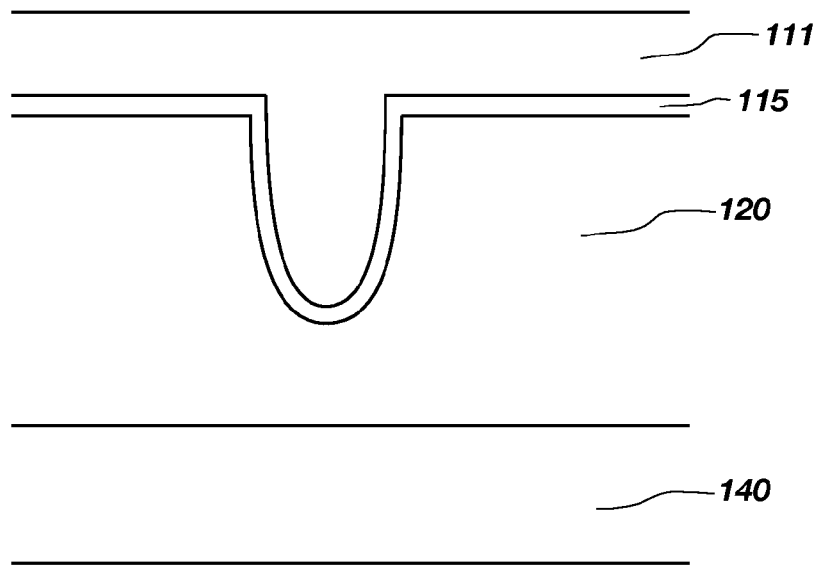

After forming the gate dielectric material 115, the gate 110 may be formed in the trench 145. Referring to FIG. 7C, a layer of gate material 111 may be deposited over the workpiece. The layer of gate material 111 may comprise conductive polysilicon (which may be doped) or any other conductive gate material. The layer of gate material 111 may be formed using, for example, low pressure chemical vapor deposition (LPCVD) or other conventional methods. If the layer of gate material 111 comprises a doped material (e.g., doped polysilicon), the layer of gate material 111 may be doped during formation of the layer of gate material 111 by adding a dopant gas such as phosphine or arsine to the CVD source gas mixture, or the layer of gate material 111 may be doped after forming the layer of gate material 111 by implanting ions into the gate material 111 to render the layer of gate material 111 conductive. In additional embodiments, the gate material 111 may be or comprise other materials, such as TaSiN, TiN, TaN, HfN, WN, MoN, a metal, metal alloys, metal oxides, or any combination thereof (e.g., a multi-layer structure comprising a plurality of layers of such materials), which may prevent a depletion layer from occurring and provide low gate resistance.

Figure 7D:
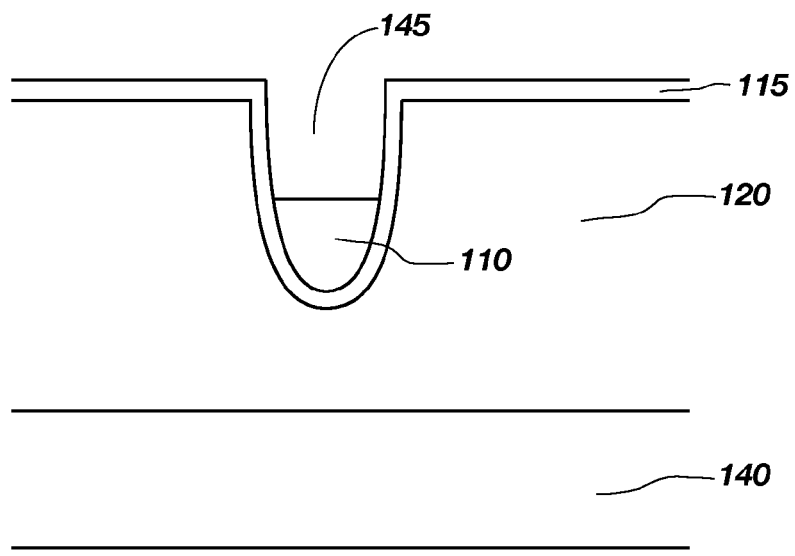
Figure 7E:
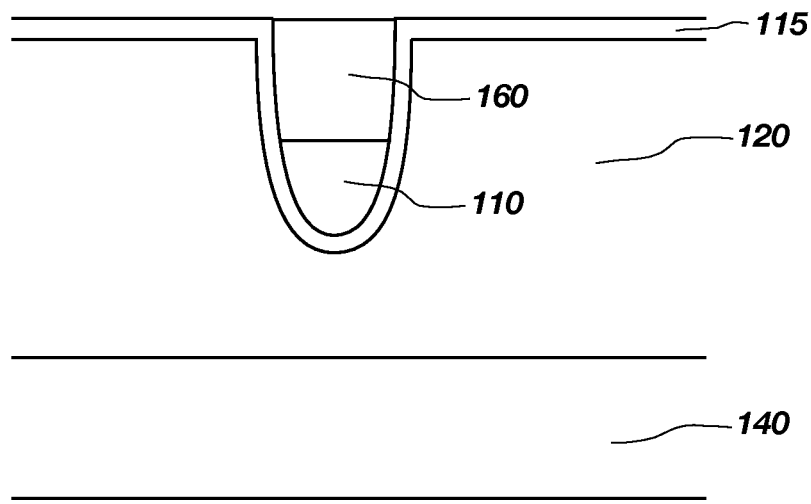

The layer of gate material 111 may be etched by any conventional method such as plasma etching or wet chemical etching to form the gate 110. After etching, the gate 110 may fill approximately one-half the depth of the trench 145. (FIG. 7D). The gate 110 may have a height ranging from approximately 500 Å to approximately 2,000 Å. In one embodiment, the gate 110 is recessed in a trench and has a height of approximately 500 Å. A cap 160 formed of a non-conducting or insulating material may be deposited over the gate 110 to fill the trench 145, as shown in FIG. 7E. The cap 160 may be formed from a nitride or oxide, such as aluminum oxide. Optionally, the cap 160 may be etched or planarized to be substantially level with the top of the trench 145.

Figure 7F:
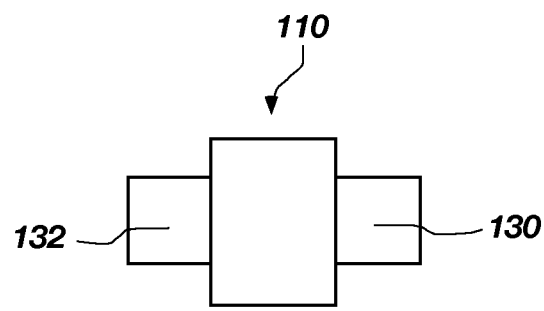
FIG. 7F is a plan view of an embodiment of a recessed I-MOS of the invention.

Dopants may be implanted to form the source and drain regions 130, 132 (FIG. 4) on opposing sides of the gate 110 using doping methods known in the art, such as, for example, ion implantation methods. By way of example and not limitation, a first mask (not shown) may be formed over the impact ionization device 100 such that only the region where the source region 130 (FIG. 4) is to be formed is exposed. Implantation may be provided into the exposed source region 130. The implantation process may be used to form a P+ doped source region 130 that is self-aligned to the edges of the trench 145. P-type dopants conventionally include ions of the elements in Group 13 of the periodic table. For example, the dopant of the source region 130 may comprise boron. The first mask may be removed by conventional methods, and a second mask (not shown) may be formed over the impact ionization device 100 such that only the drain region 132 is exposed. A second, relatively heavy ion implantation may be made self-aligned to the opposite side of the trench 145 with an N-type dopant. N-type dopants conventionally include ions of elements from Group 15 of the periodic table such as, for example, phosphorus, arsenic or antimony. Thus, the source region 130 and the drain region 132 are oppositely doped. The drain region 132 may extend below the cap 160 to abut an upper portion of the gate 110. After forming the drain region 132, the second mask (not shown) may be removed by conventional methods. FIG. 7F is a plan view of a source region 130 and a drain region 132 formed on or in a substrate 120 (FIG. 7A) on opposing sides of a gate 110, as discussed above.

Figure 8:
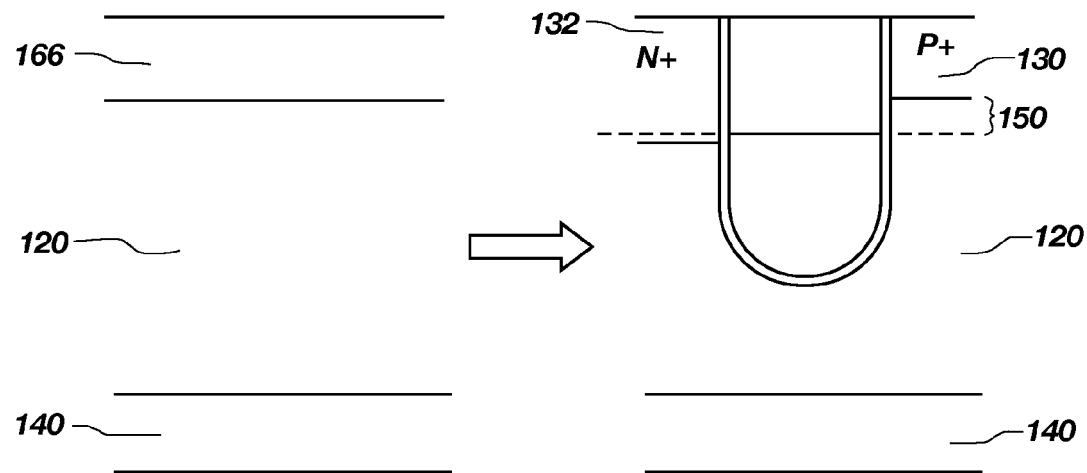
FIG. 8 is a cross-sectional view of an embodiment of a recessed I-MOS transistor of the invention.

The threshold voltage of the impact ionization device 100 may be at least partially determined by the impact ionization coefficients of the material used to make the transistor, and in particular, the material comprising the impact ionization region 150 of the impact ionization device 100. Since silicon has low impact ionization coefficients, the threshold voltage can be high in impact ionization devices in which the impact ionization region 150 comprises a silicon-based material. Complicated biasing schemes have been proposed to address this issue such as, for example, applying a negative voltage to the source region 130. However, applying a negative voltage to the source region 130 may not be ideal. Thus, in some embodiments of the invention, the impact ionization device 100 may comprise a layer of material 166 in the impact ionization region 150 having a high impact ionization rate on a surface of the substrate 120, as shown in FIG. 8. The layer of material 166 preferably has an impact ionization rate greater than silicon. By way of example and not limitation, the layer of material 166 may include any material having an impact ionization rate relatively higher than that of silicon, such as, but not limited to, germanium and silicon germanium alloys. As one particular non-limiting example, the layer of material 166 may comprise a layer of epitaxial silicon germanium (SiGe). Since SiGe has a higher impact ionization rate than silicon, the threshold voltage of the impact ionization device 100 may be lowered relative to previously known I-MOS devices.

By way of example and not limitation, prior to formation of the trench 145, the layer of material 166 may be formed on an upper surface of the substrate 120 such that the trench 145 extends below the layer of material 166 and into the substrate 120. (FIG. 8) In this configuration, the impact ionization region 150 may be substantially comprised of the layer of material 166, as shown in FIG. 8. The N+ drain region 132 may extend below the layer of material 166 and into the substrate 120.

Figure 9A:
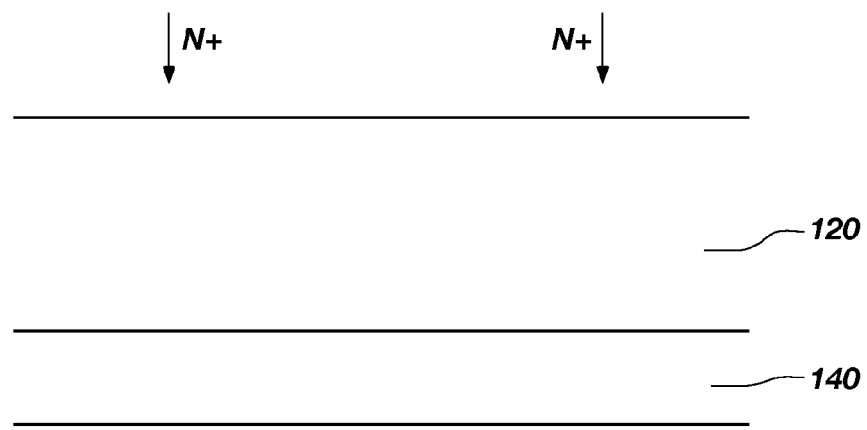
FIGS. 9A-9F are cross-sectional views of a work piece at various stages of an embodiment of a method of forming a vertical I-MOS transistor of the invention.
Figure 9B:
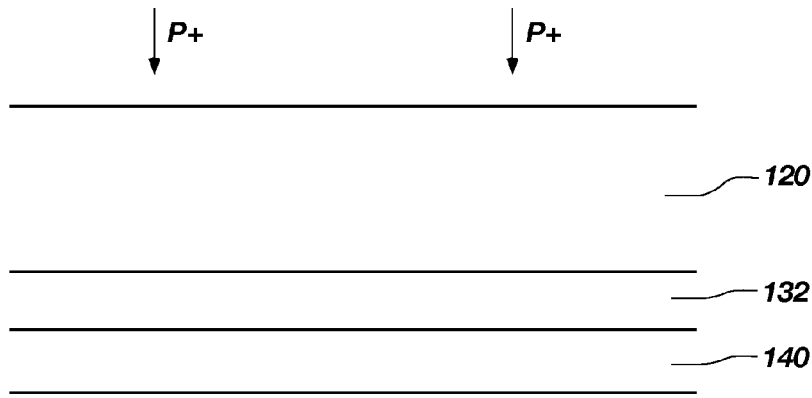
Figure 9C:
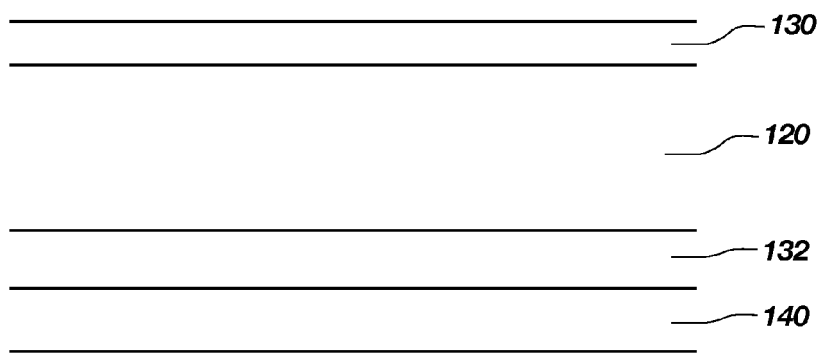

FIGS. 9A-9F depict an example of an embodiment of a method of forming an embodiment of a vertical I-MOS device of the invention, such as the impact ionization device 100' shown in FIG. 5. The impact ionization device 100' (FIG. 9F) may be formed by providing a substrate 120, which may optionally comprise a buried oxide layer 140. Dopants may then be implanted into the substrate 120 to form the source and drain regions 130, 132. Referring to FIG. 9A, a first, deep ion implantation process may be performed to form the N+ drain region 132. As shown in FIG. 9B, a second, relatively shallow ion implantation process may be performed to form the P+ source region 130 on an upper surface of the substrate 120, which is shown in FIG. 9C. In this configuration, the source and drain regions 130, 132 are formed of opposite conductivity type (N or P).

Figure 9D:
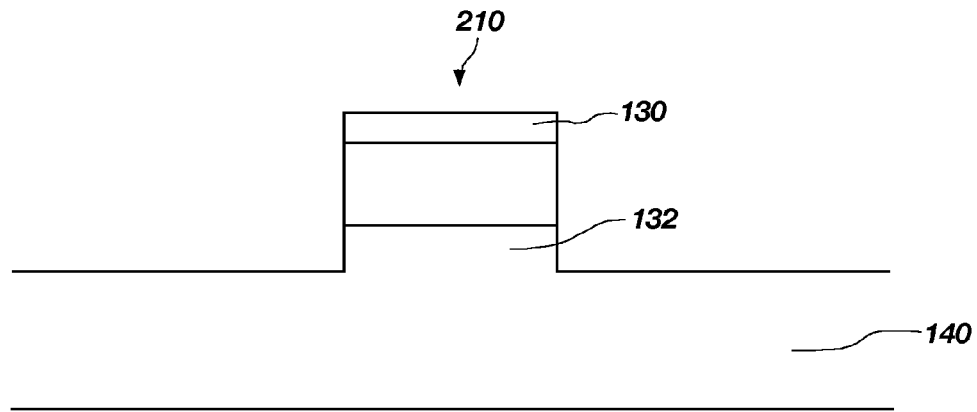
Figure 9E:
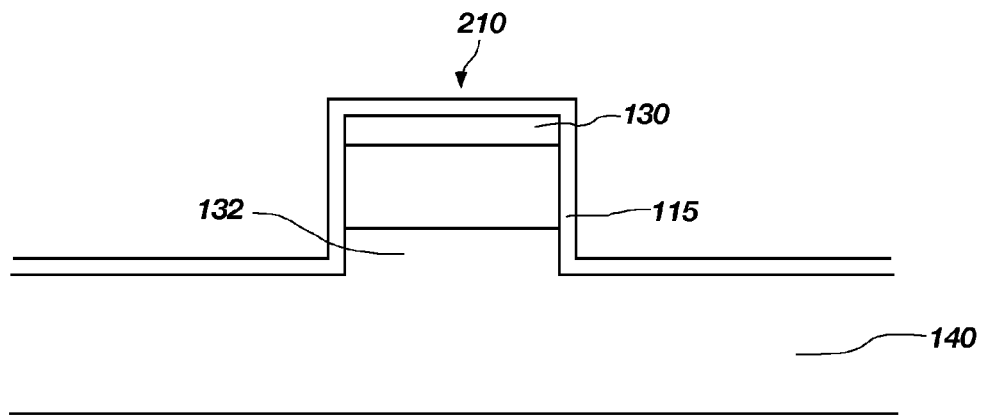

After implantation, the substrate 120 may be masked and etched to form a pillar 210, as shown in FIG. 9D. Next, gate dielectric material 115 may be provided over the substrate 120 and pillar 210, as shown in FIG. 9E. The gate dielectric material 115 may comprise any of the gate dielectric materials 115 previously described in relation to the impact ionization device 100, and may be formed using any of the methods previously described in relation to the impact ionization device 100.

Figure 9F:
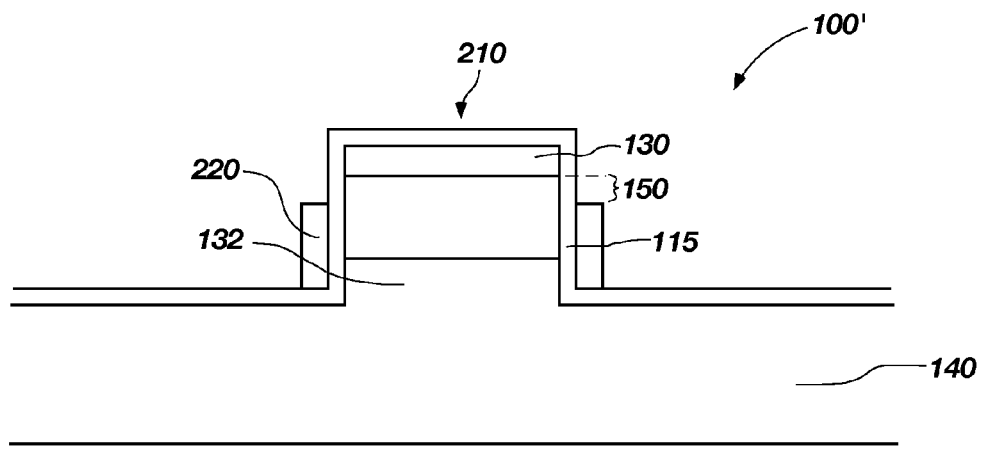

Referring to FIG. 9F, a gate material (not shown) may be deposited and then recessed (e.g., etched) to form a gate 220. A layer of gate material may be deposited over the silicon pillar 210. The layer of gate material may comprise conductive polysilicon (which may be doped) or any other conductive gate material. The layer of gate material may be formed using, for example, low pressure chemical vapor deposition (LPCVD) or other conventional methods. If the layer of gate material comprises a doped material (e.g., doped polysilicon), the layer of gate material may be doped during formation of the layer of gate material by adding a dopant gas such as phosphine or arsine to the CVD source gas mixture, or the layer of gate material may be doped after forming the layer of gate material by implanting ions into the gate material to render the layer of gate material conductive. In additional embodiments, the gate material may be or comprise other materials, such as TaSiN, TiN, TaN, a metal, or any combination thereof (e.g., a multi-layer structure comprising a plurality of layers of such materials), which may prevent a depletion layer from occurring and provide low gate resistance. The gate material may be etched to form the gate 220 by any conventional method such as plasma etching or wet chemical etching.

Figure 10:
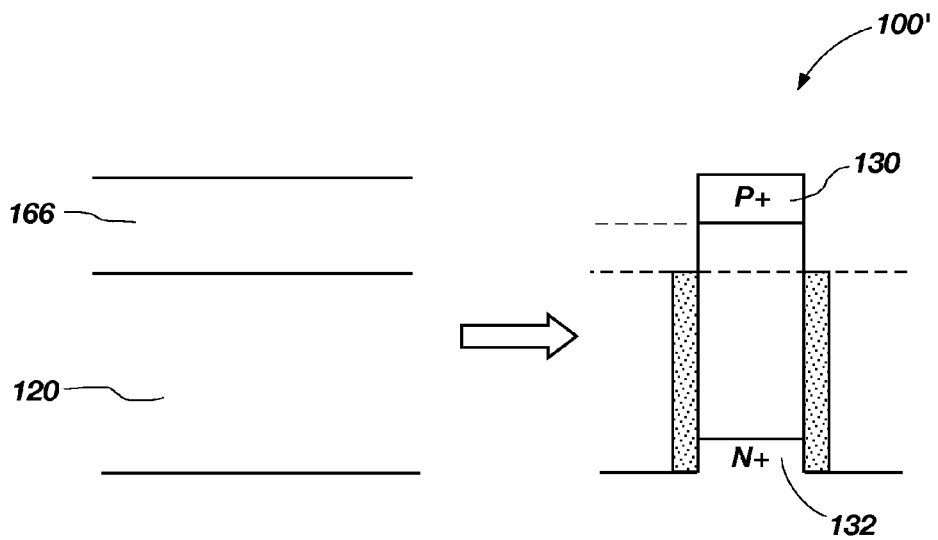
FIG. 10 is a cross-sectional view of an embodiment of a vertical I-MOS transistor of the invention.

In some embodiments of the invention, the impact ionization device 100' may include a material 166 on a surface of the substrate 120, as shown in FIG. 10. By way of example and not limitation, the material 166 may be formed on an upper surface of the substrate 120. The P+ source region 130 may be located in an upper portion of the layer of material 166 such that the region between a lower surface of the P+ source region 130 and the lower level of the layer of material 166 creates the impact ionization region 150. By way of example and not limitation, the layer of material 166 may include any material having an impact ionization rate relatively higher than that of silicon, such as, but not limited to, germanium and silicon germanium alloys. As one particular non-limiting example, the layer of material 166 may comprise a layer of epitaxial silicon germanium (SiGe). Since SiGe has a higher impact ionization rate than silicon, the threshold voltage of the impact ionization device 100' may be lowered relative to previously known I-MOS devices.

The impact ionization devices according to embodiments of the invention may be formed using conventional processing techniques. The devices require a lower threshold voltage than conventional MOSFET devices while maintaining a footprint equal to or less than conventional MOSFET devices. The impact ionization devices according to embodiments of the invention have superior scalability to prior art devices and may have dimensions of about 100 nm or less.

While the impact ionization devices have been described with respect to MOSFET devices, it will be understood that the methods and structures disclosed herein may be applied to any impact ionization device.

The invention is susceptible to various modifications and alternative forms in addition to specific embodiments shown by way of example in the drawings and described in detail herein. Thus, the invention is not limited to the particular forms disclosed. Rather, the scope of the invention encompasses all modifications, equivalents, and alternatives falling within the following appended claims.

What is claimed is:

1. An impact ionization device, comprising:
    a pillar vertically extending from an oxide material and comprising:
        N+ doped silicon vertically adjacent the oxide material;
        undoped epitaxial silicon germanium vertically overlying the N+ doped silicon; and
        P+ doped epitaxial silicon germanium vertically adjacent the undoped epitaxial silicon germanium; and
    a gate adjacent the pillar and comprising a lower portion laterally adjacent the N+ doped silicon of the pillar and an upper surface vertically separated from a lower boundary of the P+ doped epitaxial silicon germanium of the pillar, the undoped epitaxial silicon germanium of the pillar vertically confined between the lower boundary of the P+ doped epitaxial silicon germanium and the upper surface of the gate.

2. The impact ionization device of claim 1, further comprising an insulating material between the gate and the pillar.

3. The impact ionization device of claim 2, wherein the gate surrounds at least a portion of the pillar.

4. A method of forming an impact ionization device, the method comprising:
    forming a substrate comprising an oxide material, N+ doped silicon vertically adjacent the oxide material, undoped epitaxial silicon germanium vertically overlying the N+ doped silicon, and P+ doped epitaxial silicon germanium vertically adjacent the undoped epitaxial silicon germanium;
    removing material of the substrate to form a pillar vertically extending from the oxide material and comprising the N+ doped silicon, the undoped epitaxial silicon germanium, and the P+ doped epitaxial silicon germanium; and
    forming a gate adjacent the pillar and comprising a lower portion laterally adjacent the N+ doped silicon of the pillar and an upper surface vertically separated from a lower boundary of the P+ doped epitaxial silicon germanium of the pillar, the undoped epitaxial silicon germanium of the pillar vertically confined between the lower boundary of the P+ doped epitaxial silicon germanium and the upper surface of the gate.

5. The method of claim 4, wherein forming a gate adjacent the pillar comprises depositing gate material over the pillar and removing at least a portion of the gate material from a surface of the pillar.

6. The method of claim 4, wherein removing material of the substrate to form a pillar comprises etching the substrate to a depth of approximately 1,000 Å.

7. The impact ionization device of claim 1, wherein the undoped epitaxial silicon germanium of the pillar exhibits a substantially rectangular shape.

8. The impact ionization device of claim 1, wherein the pillar comprises undoped silicon between an upper boundary of the N+ doped silicon and a lower boundary of the undoped epitaxial silicon germanium.

9. The impact ionization device of claim 2, wherein the insulating material is selected from the group consisting of aluminum oxide and a nitride.

10. An impact ionization device, comprising:
    a pillar vertically extending from an oxide material and comprising:
        a drain region comprising doped silicon having a first conductivity vertically adjacent the oxide material;
        an undoped region comprising undoped silicon vertically adjacent the drain region;
        an impact ionization region comprising undoped silicon germanium vertically adjacent the undoped region; and
        a source region vertically adjacent the impact ionization region and comprising doped silicon germanium having a second conductivity opposite the first conductivity of the drain region; and
    a gate flanking opposing lateral surfaces of the pillar, a lower portion of the gate laterally adjacent the drain region, and an upper surface of the gate substantially coplanar with a lower boundary of the undoped silicon germanium of the impact ionization region.

11. The impact ionization device of claim 1, wherein the gate is located directly on lateral surfaces of the pillar.

12. The impact ionization device of claim 11, wherein a lower surface of the gate directly contacts an upper surface of the oxide material.

13. The impact ionization device of claim 1, further comprising a dielectric material extending continuously over each of a top surface and side surfaces of the pillar and a top surface of the oxide material.

* * * * *